(12) United States Patent
Kim et al.

(10) Patent No.: US 9,331,127 B2
(45) Date of Patent: May 3, 2016

(54) ORGANIC LIGHT-EMITTING DISPLAY APPARATUS AND METHOD OF MANUFACTURING THE SAME

(71) Applicant: SAMSUNG DISPLAY CO., LTD., Yongin, Gyeonggi-Do (KR)

(72) Inventors: Kyu-Seok Kim, Yongin (KR); Jung-Mi Jang, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/062,596

(22) Filed: Oct. 24, 2013

(65) Prior Publication Data

US 2014/0361260 A1 Dec. 11, 2014

(30) Foreign Application Priority Data

Jun. 7, 2013 (KR) .......................... 10-2013-0065462

(51) Int. Cl.
*H01L 29/08* (2006.01)
*H01L 27/32* (2006.01)
*H01L 51/52* (2006.01)

(52) U.S. Cl.
CPC ........... *H01L 27/3246* (2013.01); *H01L 27/326* (2013.01); *H01L 27/3211* (2013.01); *H01L 51/5203* (2013.01)

(58) Field of Classification Search
CPC ... H01L 27/3246; H01L 33/08; H01L 27/326; H01L 51/5203
USPC .......................................................... 257/40
See application file for complete search history.

(56) References Cited

U.S. PATENT DOCUMENTS

| 2003/0155860 | A1* | 8/2003 | Choi et al. ..................... 313/498 |
| 2006/0127697 | A1* | 6/2006 | Lee et al. ....................... 428/690 |
| 2009/0236976 | A1* | 9/2009 | Lee .................... H01L 51/5284 313/504 |
| 2012/0012834 | A1* | 1/2012 | Sonoda et al. ................... 257/40 |
| 2012/0104422 | A1 | 5/2012 | Lee et al. |
| 2012/0181525 | A1* | 7/2012 | Sugimoto et al. ............... 257/40 |
| 2012/0217516 | A1* | 8/2012 | Hatano et al. ................... 257/88 |

FOREIGN PATENT DOCUMENTS

| KR | 1020080051220 | 6/2008 |
| KR | 1020080052798 | 6/2008 |
| KR | 1020120044876 | 5/2012 |

OTHER PUBLICATIONS

US Publication No. 20120104422 corresponds to KR Publication No. 10-2012-0044876.

* cited by examiner

*Primary Examiner* — Thao X Le
*Assistant Examiner* — Laura Dykes
(74) *Attorney, Agent, or Firm* — F. Chau & Associates, LLC (57) ABSTRACT

A organic light-emitting display apparatus includes a substrate, a thin film transistor disposed on the substrate and including an active layer, a gate electrode, a source electrode and a drain electrode, a pixel electrode electrically connected to the source electrode and the drain electrode, a counter electrode corresponding to the pixel electrode, a light-emitting layer disposed in a plurality of light-emitting regions between the pixel electrode and the counter electrode, a common layer disposed in the light-emitting regions and in a plurality of non-light-emitting regions around the light-emitting regions between the pixel electrode and the counter electrode, and a plurality of partition walls including an insulating material disposed in the common layer.

9 Claims, 7 Drawing Sheets

(PRIOR ART)

ORGANIC LIGHT-EMITTING DISPLAY APPARATUS AND METHOD OF MANUFACTURING THE SAME

CROSS-REFERENCE TO RELATED PATENT APPLICATION

This application claims priority to Korean Patent Application No. 10-2013-0065462, filed on Jun. 7, 2013, the disclosure of which is hereby incorporated by reference herein in its entirety.

TECHNICAL FIELD

The present disclosure relates to an organic light-emitting display apparatus and a method of manufacturing the same, and more particularly, to an organic light-emitting display apparatus capable of blocking a leakage current flowing in a common layer and a method of manufacturing the same.

DISCUSSION OF THE RELATED ART

Organic light-emitting display apparatuses have received much attention as advanced display devices due to, for example, their wide viewing angle, fast response speed, low power consumption, small weight, and low profile design.

A light-emitting layer in an organic light-emitting display apparatus emits light when a current flows between an anode and a cathode connected to a thin film transistor (TFT). Common layers for transporting and injecting electrons and holes are included between the anode and the cathode in addition to the light-emitting layer. The common layers are formed in non-light-emitting regions in addition to light-emitting regions.

SUMMARY OF THE INVENTION

Exemplary embodiments of the present invention provide an organic light-emitting display apparatus that may prevent generation of stains on a screen thereof by stopping a leakage current from flowing in a common layer.

According to an exemplary embodiment of the present invention, there is provided an organic light-emitting display apparatus including: a substrate, a thin film transistor disposed on the substrate and including an active layer, a gate electrode, a source electrode and a drain electrode. The organic light-emitting display apparatus further includes a pixel electrode electrically connected to the source electrode and the drain electrode, a counter electrode corresponding to the pixel electrode, a light-emitting layer disposed in a plurality of light-emitting regions between the pixel electrode and the counter electrode, and a common layer disposed in the light-emitting regions and non-light-emitting regions around the light-emitting regions between the pixel electrode and the counter electrode, and a plurality of partition walls including an insulating material disposed in the common layer.

The partition wall may include one or more materials selected from the group consisting of polyimide, polyamide, an acryl resin, benzocyclobutene, a phenol resin, $SiO_2$, $SiN_x$, $Al_2O_3$, $CuO_x$, $Tb_4O_7$, $Y_2O_3$, $Nb_2O_5$, or $Pr_2O_3$.

The partition walls may be disposed in the non-light-emitting region between the light-emitting regions.

The partition walls may be configured to block a current from flowing in the common layer.

The common layer may have a discontinuity at the partition walls.

The common layer may include a hole injection layer, a hole transport layer, an electron transport layer, and an electron injection layer.

The common layer may include a hole injection layer, a hole transport layer, an electron transport layer, and an electron injection layer, which are sequentially disposed in a direction from the pixel electrode toward the counter electrode, and the light-emitting layer may be disposed between the hole transport layer and the electron transport layer.

The organic light-emitting display apparatus may further include a pixel-defining layer disposed in the non-light-emitting region, and the partition walls may be disposed on the pixel-defining layer.

According to an exemplary embodiment of the present invention, there is provided a method of manufacturing an organic light-emitting display apparatus. The method includes forming a thin film transistor including an active layer, a gate electrode, a source electrode and a drain electrode on a substrate, forming a planarization layer on the thin film transistor; forming a pixel electrode connected to the source electrode and the drain electrode on the planarization layer, forming a pixel-defining layer exposing a part of the pixel electrode on the planarization layer, and forming a common layer and a light-emitting layer. The light-emitting layer is disposed in the light-emitting region and the common layer including a plurality of partition walls therein is disposed in a plurality of non-light-emitting regions on the pixel-defining layer. In addition, the method further includes forming a counter electrode on substantially an entire surface of the substrate.

The forming of the common layer and the light-emitting layer may include forming a first common layer on substantially the entire surface of the substrate, forming the light-emitting layer in light-emitting regions on the first common layer, forming a second common layer on substantially the entire surface of the substrate, and forming the partition walls on the first common layer and the second common layer corresponding to a portion of the non-light-emitting regions.

The forming of the partition walls may include forming a plurality of slits in some areas by laser cutting, and forming the partition walls including an insulating material in the slits.

The forming of the common layer and the light-emitting layer may include forming a first common layer having a plurality of first slits in some areas of the non-light-emitting regions by using a first mask, forming the light-emitting layer in light-emitting regions on the first common layer, forming a second common layer having a plurality of second slits in the some areas by using a second mask, and forming the partition walls including an insulating material in the first slits and the second slits.

The partition wall may include at least one material selected from the group consisting of polyimide, polyamide, an acryl resin, benzocyclobutene, a phenol resin, $SiO_2$, $SiN_x$, $Al_2O_3$, $CuO_x$, $Tb_4O_7$, $Y_2O_3$, $Nb_2O_5$, and $Pr_2O_3$.

The first slits and the second slits may be connected to each other.

The first common layer may include a hole injection layer and a hole transport layer, and the second common layer may include an electron transport layer and an electron injection layer.

According to an exemplary embodiment of the present invention, there is provided an organic light-emitting display apparatus including: a plurality of light-emitting regions and a plurality of non-light-emitting regions disposed between the plurality of light-emitting regions. The light-emitting regions may be configured to emit light when a current flows from a pixel electrode to a counter electrode through a common layer and a light-emitting layer, and the common layer may include a plurality of partition walls that are disposed in some areas of the non-light-emitting regions and include an insulating material.

The partition wall may include at least one material selected from the group consisting of polyimide, polyamide, an acryl resin, benzocyclobutene, a phenol resin, $SiO_2$, $SiN_x$, $Al_2O_3$, $CuO_x$, $Tb_4O_7$, $Y_2O_3$, $Nb_2O_5$, and $Pr_2O_3$.

The light-emitting layer may be disposed in the light-emitting regions and the common layer may be disposed in the light-emitting regions and the non-light-emitting regions.

The partition walls may be configured to block a current from flowing in the common layer.

The common layer may have a discontinuity at the partition walls.

According to an exemplary embodiment, an organic light-emitting display apparatus is provided. The organic light-emitting display apparatus includes a plurality of light-emitting regions disposed on a substrate. The light-emitting regions include a red sub-pixel, a green sub-pixel and a blue sub-pixel.

The organic light-emitting display apparatus further includes a plurality of non-light-emitting regions disposed between the red sub-pixel, the green sub-pixel and the blue sub-pixel, a thin film transistor including an active layer disposed on the substrate, a gate dielectric layer disposed on the active layer, a gate electrode disposed on the gate dielectric layer, a source electrode and a drain electrode, an interlayer dielectric covering the gate electrode, in which the source electrode and the drain electrode are disposed on the interlayer dielectric, a planarization layer disposed on the TFT and the interlayer dielectric, a pixel electrode disposed on the planarization layer and connected to the source electrode and the drain electrode through a via hole in the planarization layer, a pixel defining layer having a plurality of openings therein and disposed on the planarization layer and on edge portions of the pixel electrode, a common layer including a hole injection layer, a hole transport layer, an electron transport layer, and an electron injection layer disposed in the openings in areas corresponding to the red sub-pixel, the green sub-pixel and the blue sub-pixel of the light-emitting regions and on surfaces of the pixel defining layer in areas corresponding to the non-light-emitting regions, and a light emitting layer disposed between the hole transport layer and the electron transport layer in the areas corresponding to the red sub-pixel, the green sub-pixel and the blue sub-pixel of the light emitting regions. The light emitting layer is not disposed in the non-light-emitting regions;

In addition, the organic light-emitting display apparatus further includes a counter electrode disposed on the common layer in the light-emitting regions and the non-light-emitting regions and a plurality of partition walls including an insulating material and disposed in the common layer in the non-light-emitting regions between the red sub-pixel, the green sub-pixel and the blue sub-pixel.

BRIEF DESCRIPTION OF THE DRAWINGS

Exemplary embodiments of the present invention can be understood in more detail from the following detailed description taken in conjunction with the attached drawings in which.

DETAILED DESCRIPTION OF EXEMPLARY EMBODIMENTS OF THE INVENTION

In the following detailed description, reference is made to the accompanying drawings that show, by way of illustration, specific embodiments according to which the claimed subject matter may be practiced. These embodiments are described in sufficient detail to enable those skilled in the art to practice the subject matter. It is to be understood that the various embodiments, although different, are not necessarily mutually exclusive. In the drawings, like reference numerals refer to the same or similar elements throughout. Also, in the drawings, the thickness of layers, films, panels, regions, etc., may be exaggerated for clarity.

As used herein, the term "and/or" includes any and all combinations of one or more of the associated list items. Also, as used herein, the singular forms, "a", "an", and "the" are intended to include plural forms as well, unless the context clearly indicates otherwise.

Hereinafter, exemplary embodiments of the present invention will be described with reference to the accompanying drawings.

Figure 1:
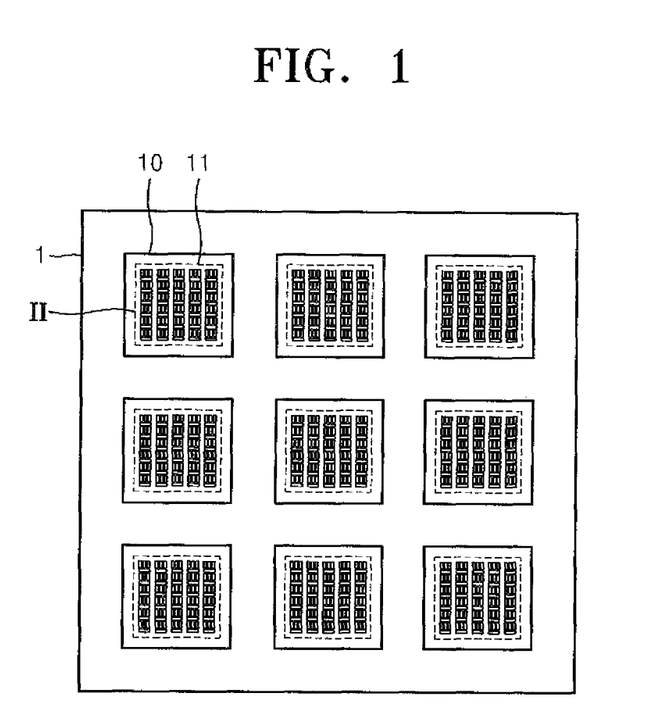
FIG. 1 is an overall plan view schematically illustrating an organic light-emitting display apparatus according to an embodiment of the present invention.

FIG. 1 is an overall plan view schematically illustrating an organic light-emitting display apparatus according to an embodiment of the present invention.

Figure 2:
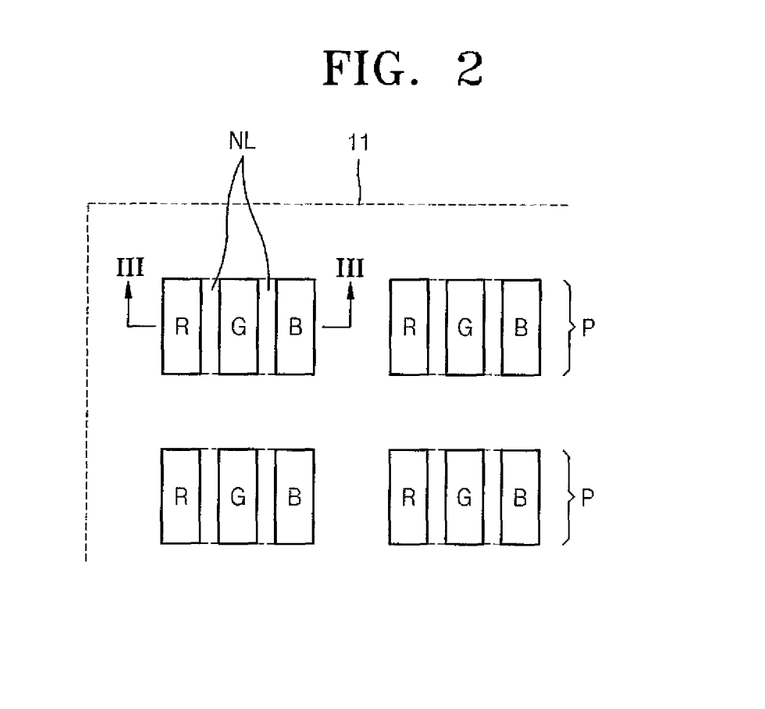
FIG. 2 schematically illustrates a display unit of the organic light-emitting display apparatus according to an embodiment of the present invention.

Referring to FIG. 1, a plurality of organic light-emitting display apparatuses 10 according to an embodiment of the present invention is included on a substrate 1. Each organic light-emitting display apparatus 10 includes, for example, a display unit 11 including a plurality of pixel units P. FIG. 2 schematically illustrates the inside of the display unit 11 of the organic light-emitting display apparatus 10 according to the present embodiment of the present invention.

Figure 3:
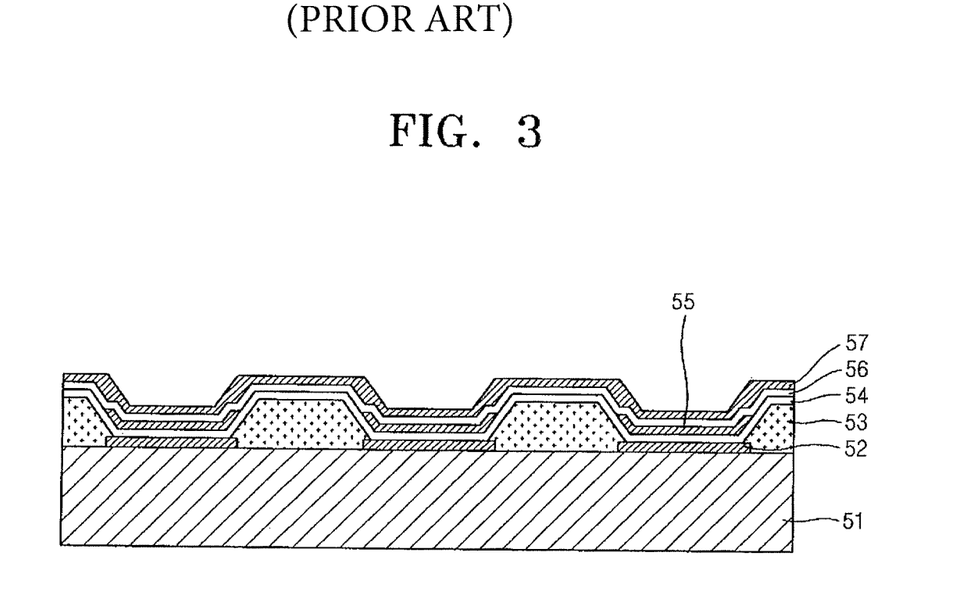
FIG. 3 illustrates causes of the occurrence of stains in a conventional organic light-emitting display apparatus.

More specifically, FIG. 2 is an enlarged plan view illustrating portion II of FIG. 1, and FIG. 3 is a cross-sectional view taken along line III-III of FIG. 2.

Referring to FIG. 2, the touch screen organic light-emitting display apparatus 10 according to the present embodiment of the present invention includes, for example, the plurality of pixel units P in the display unit 11.

As illustrated in FIG. 2, each pixel unit P is composed of, for example, three sub-pixels, e.g., red sub-pixel (R), green sub-pixel (G) and blue sub-pixel (B) disposed in a row. However, exemplary embodiments of the present invention are not limited thereto. That is, the type, size, and arrangement of the sub-pixels R, G, and B constituting each pixel unit P may be variously changed. Also, in the specification, a region on the substrate 1 occupied by the sub-pixels R, G, and B may be referred to as a "light-emitting region L".

Also, in the pixel unit P, non-light-emitting regions NL are formed between the sub-pixels R, G, and B. The non-light-emitting region NL is a region of the pixel unit P not including a light-emitting layer 35 to be described later, and may be formed in a space between the sub-pixels R, G, and B. The non-light-emitting regions NL between the sub-pixels R, G and B separate the sub-pixels R, G and B, e.g., the light-emitting regions L, to prevent the occurrence of light interference, and thus, a clear image may be displayed.

As illustrated in FIG. 2, the plurality of non-light-emitting regions NL are formed between the pixel units P. However, this is only an example of exemplary embodiments of the present invention, and exemplary embodiments of the present invention are not limited thereto. That is, the position of each non-light-emitting region NL may be variously changed according to the arrangement of the light-emitting layer 35 and a thin film transistor TFT, which will be later described in FIG. 4, as long as the non-light-emitting region NL is disposed between the pixel units P, and for example, each non-light-emitting region NL may be placed between every two or three pixel units P.

In contrast, a conventional organic light-emitting display apparatus has limitations in that a leakage current may flow in a non-light-emitting region, thereby generating a difference in the magnitude of current that is provided to each of the sub-pixels R, G, and B. In a case where a current is provided to a specific sub-pixel and is not provided to other sub-pixels due to the leakage current, a difference in brightness may occur, which may cause the generation of stains in a black state (screen is off or in a standby mode).

FIG. 3 illustrates causes of the occurrence of stains in a conventional organic light-emitting display apparatus.

FIG. 3 is a schematic illustration example of a conventional organic light-emitting display apparatus, in which some configurations are omitted for comparison with exemplary embodiments of the present invention. For example, referring to FIG. 3, in the typical organic light-emitting display apparatus, an anode 52 is formed on a substrate 51, and electrons and holes move to a cathode 57 through common layers 54 and 56 and a light-emitting layer 55 formed on the anode 52. A pixel-defining layer 53 is disposed on the anode 52. The common layers 54 and 56, the light-emitting layer 55 and the cathode 57 are disposed on a surface of the pixel-defining layer 53 and in an opening in the pixel-defining layer 53. In this case, the light-emitting layer 55 emits light due to the moving electrons and holes. In FIG. 3, when a region including the light-emitting layer 55 is a light-emitting region, a region not including the light-emitting layer 55 is a non-light-emitting region.

In this case, a leakage current may be generated in the common layers 54 and 56 that are also included in the non-light-emitting regions. A microcurrent partially leaked from the current flowing from the anode 52 to the cathode 57 may flow in the common layers 54 and 56 and concentrate on a highly efficient organic light-emitting material included in another pixel, and thus, light may be emitted. That is, in a case where the microcurrent flowing in the common layers 54 and 56 concentrates on the specific sub-pixels R, G, and B, stains may occur in a black state of a display. Therefore, there may be a need to prevent a leakage current from flowing in the common layers 54 and 56 of the non-light-emitting regions NL between the sub-pixels R, G, and B during the manufacturing of a panel.

Figure 4:
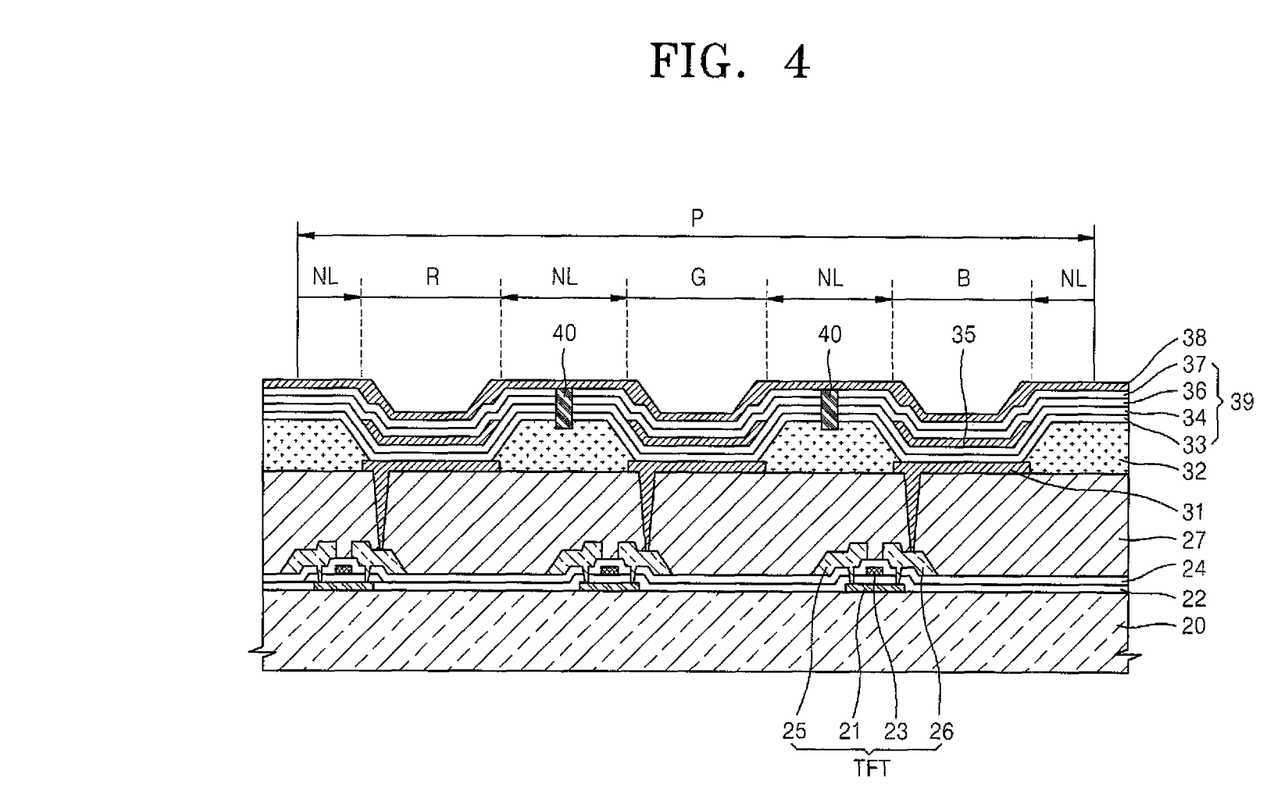
FIG. 4 is a cross-sectional view illustrating a pixel unit P of FIG. 2 in more detail.

FIG. 4 is a cross-sectional view illustrating the pixel unit P of FIG. 2 in more detail.

FIG. 4 illustrates an example of an active matrix (AM)-type organic light-emitting display apparatus in which, for example, three sub-pixels R, G and B are included on a substrate 20. The sub-pixels R, G, and B illustrated in FIG. 4 include at least one TFT. However, a structure of the TFT of exemplary embodiments of the present invention is not necessarily limited to the structure illustrated in FIG. 4, and the number and structure of the TFT may be variously changed. The AM-type organic light-emitting display apparatus will be described in detail below.

An insulating substrate of a transparent glass material having, for example, silicon oxide ($SiO_2$) as a main component, a plastic substrate, or a quartz substrate may be used as the substrate 20. Although not illustrated in FIG. 4, a buffer layer (not shown) formed of, for example, silicon oxide ($SiO_2$), silicon nitride ($SiN_x$) and/or silicon oxynitride (SiON) for the flatness of the substrate 20 and blocking the penetration of impurity elements may be formed on a top surface of the substrate 20. The substrate 20 may be, for example, a low temperature polysilicon (LTPS) substrate, a glass substrate, or a plastic substrate. Also, as mentioned above, in an embodiment, the substrate 20 may be formed of a transparent glass material having $SiO_2$ as a main component. In an embodiment, the substrate 20 may be a flexible substrate formed of a plastic material, such as, for example, polyethyeleneterepthalate (PET), polyethyelenennapthalate (PEN), polycarbonate (PC), polyallylate, polyetherimide (PEI), polyethersulphone (PES), polyimide (PI), or the like, A thin film transistor (TFT) is formed on the substrate 20. The TFT includes, for example, a semiconductor active layer 21, a gate dielectric layer 22 formed to cover the active layer 21, a gate electrode 23 on the gate dielectric layer 22, and a source electrode 25 and a drain electrode 26. The gate electrode 23 of the TFT may include, for example, silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), molybdenum (Mo), titanium (Ti), tungsten (W), molybdenum tungsten (MoW), and aluminum (Al)/copper (Cu), copper (Cu), zinc (Zn), cobalt (Co), manganese (Mn), iridium (Ir), rhodium (Rh), osmium (Os), tantalum (Ta), or a compound of any of these.

The gate dielectric layer 22 is formed of, for example, SiO2, SiNx, silicon oxynitride (SiON), aluminum oxide (AlOx), yttrium oxide ($Y_2O_3$), hafnium oxide (HfOx), zirconium oxide (ZrOx), aluminum nitride (AlN), aluminum oxynitride (AlNO), titanium oxide (TiOx), barium titanate (BaTiO3), lead titanate ($PbTiO_3$), or a combination thereof, An interlayer dielectric 24 is formed to cover the gate electrode 23, and the source electrode 25 and the drain electrode 26 are formed on the interlayer dielectric 24. The source electrode 25 and the drain electrode 26 are respectively connected to a source region and a drain region of the active layer 21 through, for example, contact holes formed in the gate dielectric layer 22 and the interlayer dielectric 24.

The source electrode 25 and the drain electrode 26 may include, for example, silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), molybdenum (Mo), titanium (Ti), tungsten (W), molybdenum tungsten (MoW), and aluminum (Al)/copper (Cu), copper (Cu), zinc (Zn), cobalt (Co), manganese (Mn), iridium (Ir), rhodium (Rh), osmium (Os), tantalum (Ta), or a compound of any of these.

A pixel electrode 31 of the pixel unit P formed on a planarization layer 27 is connected to the source/drain electrodes 25 and 26 through a via hole. A pixel-defining layer 32 is formed to cover the pixel electrode 31. Predetermined openings are formed, for example, in the pixel-defining layer 32. A common layer and a light-emitting layer 35 are then formed, and a counter electrode 38 is deposited thereon. The common layer 39 includes, for example, a hole injection layer 33, a hole transport layer 34, an electron transport layer 36, and an electron injection layer 37.

In this case, the pixel electrode 31 is used as, for example, an anode, and the counter electrode 38 is used as, for example, a cathode. However, in an embodiment, the polarities of the pixel electrode 31 and the counter electrode 38 may be reversed. A low molecular weight organic layer or a polymer organic layer may be used as, for example, the light-emitting layer 35 and the common layer 39.

Referring to FIG. 4, it may be understood that the light-emitting layer 35 is formed in areas corresponding to the sub-pixels R, G, and B which are light-emitting regions L, and the common layer 39 including the hole injection layer 33, the hole transport layer 34, the electron transport layer 36, and the electron injection layer 37 are formed irrespective of the light-emitting regions L and the non-light-emitting regions NL.

Also, as illustrated in FIG. 4, a thickness of the light-emitting layer 35 is, for example, entirely uniform. However, exemplary embodiments of the present invention are not limited thereto. That is, the light-emitting layer 35 corresponding to each of the sub-pixels R, G, and B may have, for example, different thicknesses suitable for a resonance structure or may further include an auxiliary light-emitting layer.

Referring to FIG. 4, it may be understood that partition walls 40 are formed in the common layer 39 of the non-light-emitting regions NL between the sub-pixels R, G and B. The partition walls 40 may be formed, for example, in a portion of the pixel-defining layer 32 by penetrating through the common layer 39. As the partition walls 40 are for blocking the flow of a microcurrent in the common layer 39, the partition walls 40 may be include, for example, an insulating material. An organic insulating material or an inorganic insulating material may be used as the insulating material. For example, in an embodiment, $SiO_x$, $SiN_x$, and/or SiON, may be used as the insulating material for the partition walls 40. In the present embodiment of FIG. 4, the partition walls 40 extend, for example, to a region of the pixel-defining layer 32. However, in an embodiment of the present invention, the partition walls 40 may alternatively be formed as, for example, an interface between the common layer 39 and the pixel-defining layer 32.

In a case where the insulating partition walls 40 are formed in regions of the common layer 39, the leakage of current, which flows from the pixel electrode 31 to the counter electrode 38, through the common layer 39 may be prevented. Therefore, the occurrence of a difference in brightness with respect to other sub-pixels R, G, or B due to the leakage current may be prevented too, and stains may also be stopped from occurring in a black state of the display.

Figure 5A:
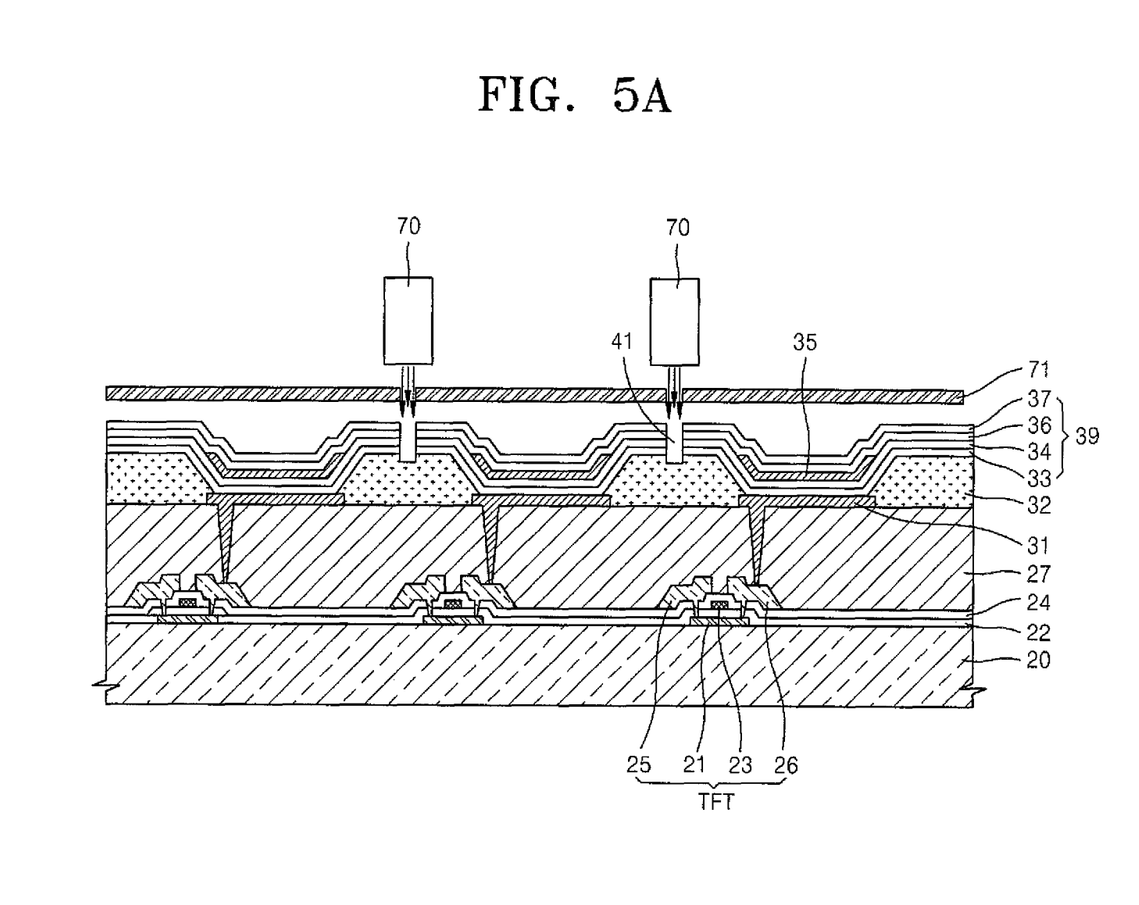
FIGS. 5A and 5B illustrate a part of a manufacturing process of an organic light-emitting display apparatus according to an embodiment of the present invention.
Figure 5B:
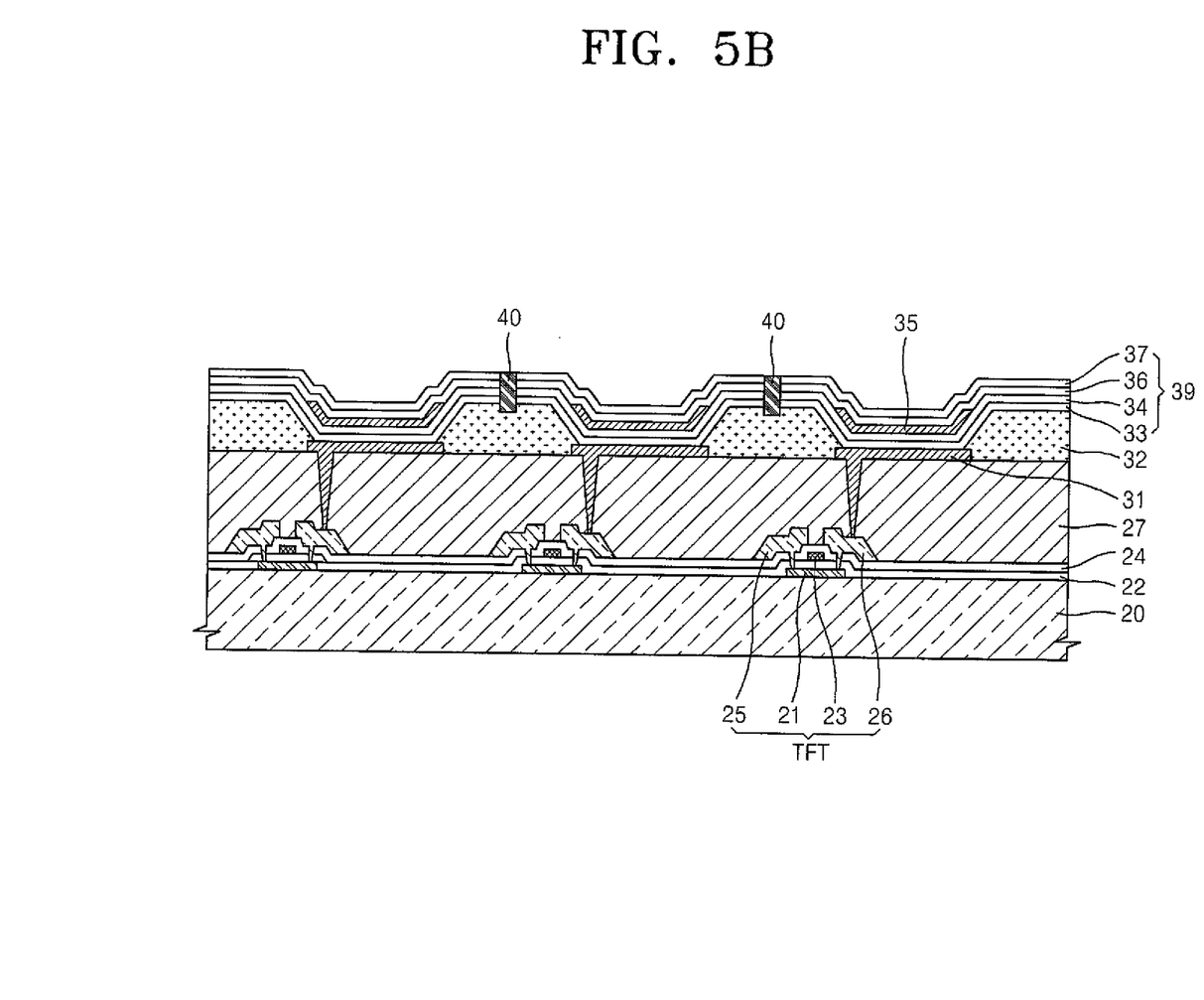
Figure 6A:
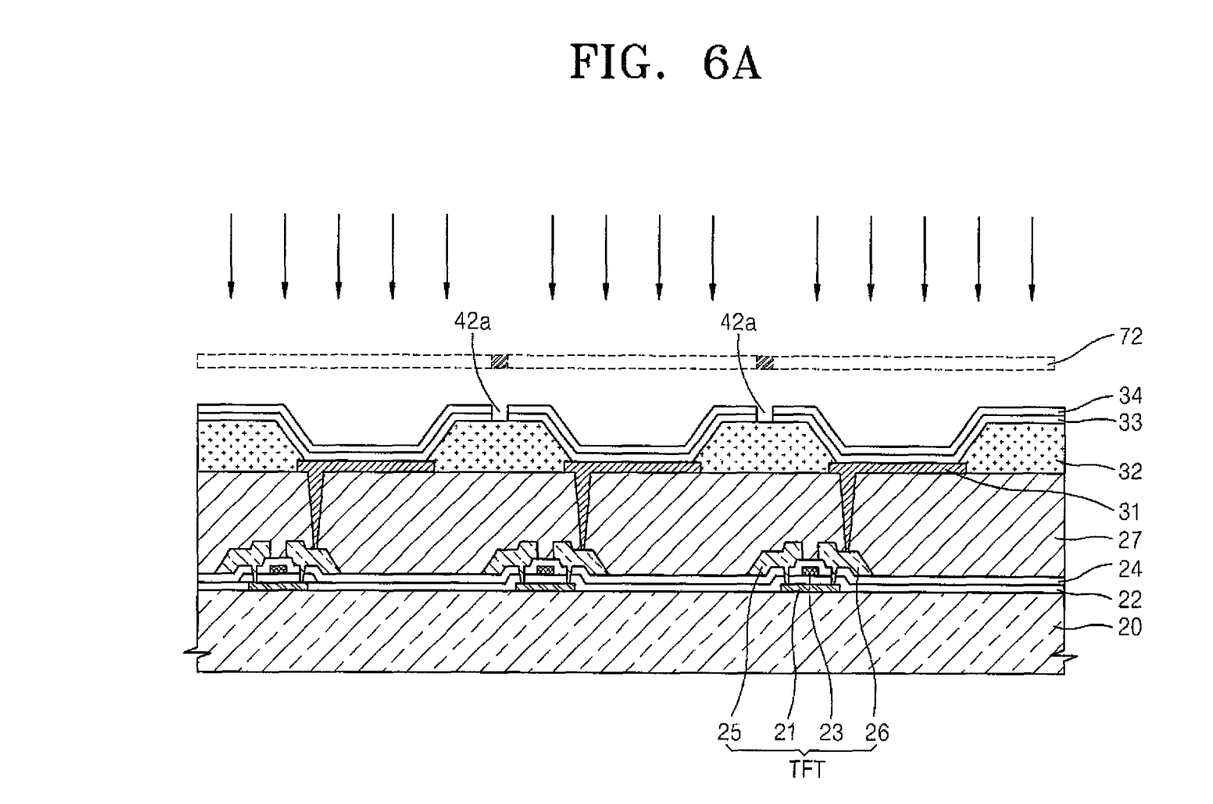
FIGS. 6A and 6B illustrate a part of a manufacturing process of an organic light-emitting display apparatus according to an embodiment of the present invention.
Figure 6B:
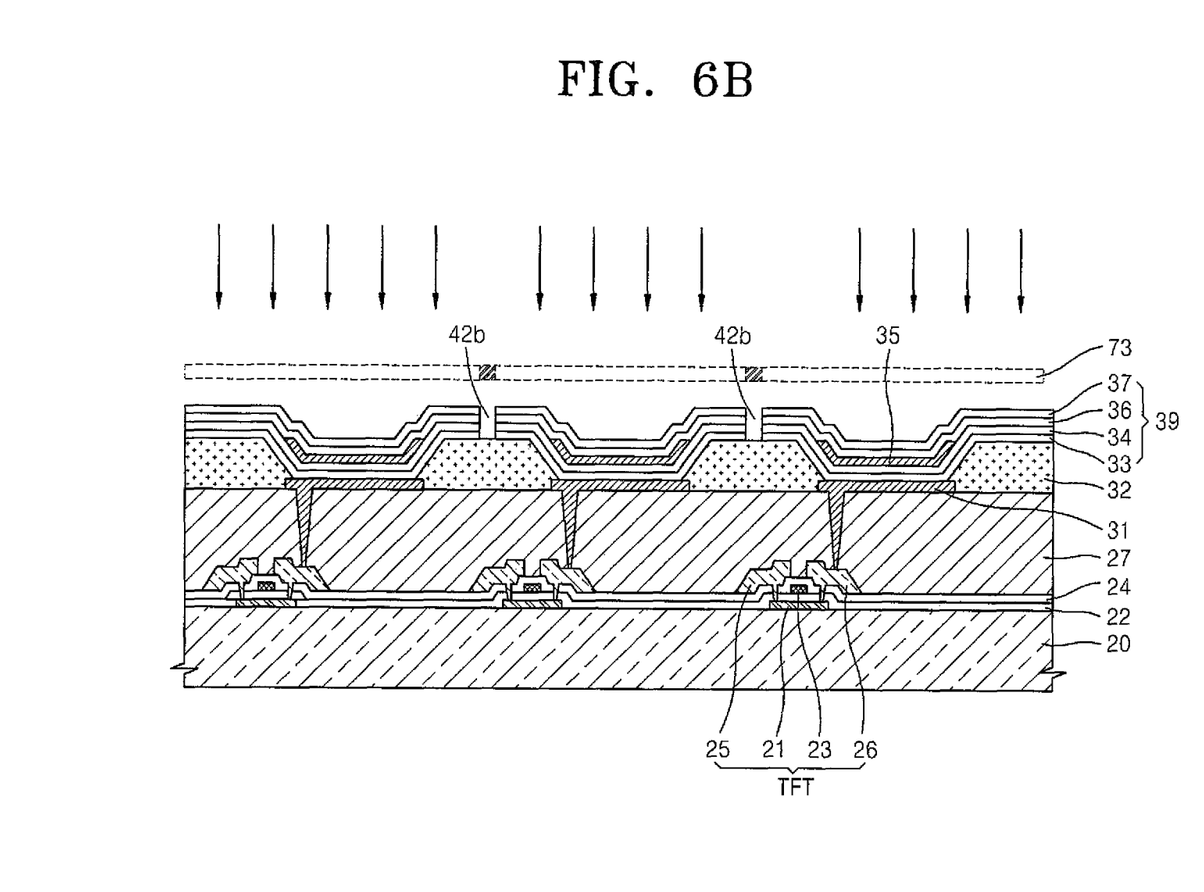

The following FIGS. 5 and 6 respectively describe a process of forming partition walls 40 according to an embodiment of the present invention.

FIGS. 5A and 5B illustrate a part of a manufacturing process of an organic light-emitting display apparatus according to an embodiment of the present invention.

The organic light-emitting display apparatus illustrated in FIG. 5A is in a state in which stacking of an electron injection layer 37 is completed, and detailed process drawings will be replaced by a brief description of processes carried out before the completion of stacking of the electron injection layer 37.

First, referring to FIG. 5A, an active layer 21 having a predetermined pattern is formed on a substrate 20.

The active layer 21 may be formed of, for example, an inorganic semiconductor, such as amorphous silicon or poly-silicon, or an organic semiconductor. However, exemplary embodiments of the present invention are not limited thereto. The active layer 21 may be formed of, for example, an oxide semiconductor. For example, an $(In_2O_3)_a(Ga_2O_3)_b(ZnO)_c$ (G—I—Z—O) layer (where a, b, and c are real numbers respectively satisfying conditions of a≥0, b≥0, and c≥0) may be used as the oxide semiconductor. In a case where the active layer 21 is formed of an oxide semiconductor, a doping process, which will be later described, may be omitted.

A gate dielectric layer 22 is formed on the patterned active layer 21. The gate dielectric layer 22 may be formed by, for example, deposition of an inorganic insulating layer, such as a $SiN_x$, $SiO_x$ and/or a SiON layer, using a method, such as a plasma enhanced chemical vapor deposition (PECVD) method, an atmospheric pressure chemical vapor deposition (APCVD) method, and a low pressure chemical vapor deposition (LPCVD) method.

Also, a gate electrode 23 of a TFT is formed on the gate dielectric layer 22. The gate electrode 23 of the TFT may include, for example, silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), molybdenum (Mo), titanium (Ti), tungsten (W), molybdenum tungsten (MoW), and aluminum (Al)/copper (Cu), copper (Cu), zinc (Zn), cobalt (Co), manganese (Mn), iridium (Ir), rhodium (Rh), osmium (Os), tantalum (Ta), or a compound of any of these. For example, the gate electrode 23 corresponds to the center of the active layer 21, and when the active layer 21 is doped with an n-type or p-type impurity by using the gate electrode 23 as a mask, a channel region is formed in an area of the active layer 21 covered with the gate electrode 23 and source/drain regions are formed at edges of the active layer 21 that are not covered with the gate electrode 23.

Next, an interlayer dielectric 24 including openings formed through, for example, a mask process is disposed on the gate electrode 23 and the gate dielectric layer 22.

The interlayer dielectric 24 may be formed by, for example, spin coating one or more organic insulating materials selected from the group consisting of polyimide, polyamide, an acryl resin, benzocyclobutene, or a phenol resin. The interlayer dielectric 24 is formed to be, for example, thicker than the above-described gate dielectric layer 22, and thus, the interlayer dielectric 24 may function as an insulating layer between the gate electrode 23 and source/drain electrodes 25 and 26 of The TFT. For example, the interlayer dielectric 24 may be formed of an inorganic material, such as the above-described gate dielectric layer 22, as well as the organic insulating materials, and the interlayer dielectric 24 may also be formed by alternatingly stacking an organic insulating material and an inorganic insulating material.

The interlayer dielectric 24 may include openings that expose some areas of the active layer 21 of the TFT to allow the source/drain electrodes 25 and 26 to be in contact with the active layer 21.

Subsequently, the source/drain electrodes 25 and 26 of the TFT are formed on the interlayer dielectric 24. A conductive layer is deposited on an entire surface of the substrate 20, and the source/drain electrodes 25 and 26 of the TFT are then formed by patterning the conductive layer. The conductive layer may be formed of a material selected from the conductive material constituting the gate electrode 23. For example, in an embodiment, the conductive layer may be formed of a Mo/Al/Mo material. The source/drain electrodes 25 and 26 may be connected to some areas of the active layer 21 through the openings formed in the interlayer dielectric 24.

Next, a planarization layer 27 is formed on the source/drain electrodes 25 and 26. The planarization layer 27 may be formed of, for example, an insulating material, and may include an opening for a pixel electrode 31 to be in contact with one of the source/drain electrodes 25 and 26. For example, an inorganic layer and/or an organic layer may be used as the planarization layer 27. The inorganic layer may include, for example, silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zirconium oxide (ZrO2), barium strontium titanate (BST), or lead zirconium titanate (PZT) or a combination thereof. The organic insulating layer may include, for example, a general-purpose polymer (e.g., polymethyl methacrylate (PMMA), polystyrene (PS)), a phenol group-containing polymer derivative, an acrylic polymer, an imide-based polymer, an arylether-based polymer, an amide-based polymer, a fluorinated polymer, a p-xylene-based polymer, a vinylalcohol-based polymer, and a blend thereof. Also, in an embodiment, the planarization layer 27 may be formed of, for example, a composite stack of inorganic insulating layers and organic insulating layers.

As described above, in the present embodiment, a top gate type TFT is disclosed. However, it will be readily understood by those skilled in the art that exemplary embodiments of the present invention are not limited to a shape or number of the TFT disclosed in FIG. 5A and may include various types of TFTs.

Next, the pixel electrode 31 is formed on the planarization layer 27 and the pixel electrode 31 may be connected to the source electrode 25 or the drain electrode 26 through a via hole. Also, a counter electrode 38 to be described later may be included as an electrode facing the pixel electrode 31. In an embodiment of the present invention, the pixel electrode 31 may function as, for example, an anode and the counter electrode 38 may function as, for example, a cathode.

As in the present embodiment, in a case where the organic light-emitting display apparatus is a top emission type in which light is emitted in a direction opposite the substrate, the pixel electrode 31 is included as an electrode that may be light reflective and the counter electrode 38 is included as an electrode that may be light transparent.

That is, the pixel electrode 31 may be included as, for example, a reflective electrode in which a reflective layer is formed of silver (Ag), magnesium (Mg), aluminum (Al), platinum (Pt), palladium (Pd), gold (Au), nickel (Ni), neodymium (Nd), iridium (Ir), chromium (Cr), or a compound thereof, and indium tin oxide (ITO), indium zinc oxide (IZO), zinc oxide (ZnO) or indium oxide ($In_2O_3$) may then be formed on the reflective layer.

The counter electrode 38 may be included as, for example, a transparent electrode. In a case where the counter electrode 38 is used as a cathode, a low work function metal, such as, for example, lithium (Li), calcium (Ca), lithium fluoride (LiF)/calcium (Ca), lithium fluoride (LiF)/aluminium (Al), aluminium (Al), silver (Ag), magnesium (Mg), or a compound thereof, is deposited to face a light-emitting layer 35, and an auxiliary electrode layer or a bus electrode line may then be formed of a material for forming a transparent electrode, such as, for example, ITO, IZO, ZnO, or $In_2O_3$, thereon.

In addition, the pixel electrode 31 may further include, for example, a reflective layer formed of Ag, Mg, Al, Pt, Pd, Au, Ni, Nd, Ir, Cr, Li, ytterbium (Yb), or Ca. In this case, the counter electrode 38 may include, for example, a transparent metal oxide, such as ITO, IZO, ZnO, or $In_2O_3$, so as to be light transparent, and may also be formed as a thin film by using, for example, a metal, such as Ag, Mg, Al, Pt, Pd, Au, Ni, Nd, Ir, Cr, Li, or Ca.

A pixel-defining layer 32 may be formed on the pixel electrode 31, and the pixel-defining layer 32 may be formed by, for example, spin coating one or more organic insulating materials or may be formed of an inorganic insulating material. Also, the pixel-defining layer 32 may be formed, for example, in a multilayer structure in which an organic insulating material and an inorganic insulating material are alternatingly stacked. The pixel-defining layer 32 may define a pixel by, for example, forming an opening to allow a center portion of an electrode representing the pixel to be exposed.

A light-emitting layer 35 and a common layer 39 are formed, for example, between the pixel electrode 31 and the counter electrode 38. The common layer 39 includes, for example, a hole injection layer 33, a hole transport layer 34, an electron transport layer 36, and an electron injection layer 37. In other words, the light-emitting layer 35 is formed on the hole injection layer 33 and the hole transport layer 34, and the electron transport layer 36 and the electron injection layer 37 are formed on the light-emitting layer 35. That is, the light-emitting layer 35 is formed between the hole transport layer 34 and the electron transport layer 36 of the common layer 39.

According to an embodiment of the present invention, slits 41 are formed, for example, in the non-light-emitting regions NL of the common layer 39 and partition walls 40 are then formed in the slits 41. The partition walls 40 according to the present embodiment of the present invention may block the leakage current from flowing in the common layer 39, and thus, the partition walls 40 may prevent the occurrence of stains even when a screen is in a black state.

For example, the hole injection layer 33 and the hole transport layer 34 are deposited on the patterned pixel-defining layer 32. The hole injection layer 33 and the hole transport layer 34 are completely deposited on the substrate 20 irrespective of the light-emitting regions L and the non-light-emitting regions NL.

Next, the light-emitting layer 35 is deposited on the hole transport layer 34 and then patterned to allow the light-emitting layer 35 only to remain in the light-emitting regions L. Then, the electron transport layer 36 and the electron injection layer 37 are completely deposited on the light-emitting regions L.

As described above, a low molecular weight organic layer or a polymer organic layer may be used as the light-emitting layer 35 and the common layer 39. In a case where a low molecular weight organic layer is used, the common layer 39 may be formed by, for example, stacking the hole injection layer (HIL) 33, the hole transport layer (HTL) 34, the emission layer (EML) 35, the electron transport layer (ETL) 36, and the electron injection layer (EIL) 37 in a single or composite structure.

An amine derivative having strong fluorescence such as, for example, a triphenyldiamine derivative, a styrylamine derivative, and an amine derivative having an aromatic fused ring, may be used as the HIL 33 and the HTL 34 of the common layer 39. For example, a quinoline derivative, such as tris(8-quinolinolato) aluminum (Alq3), a phenylanthracene derivative, and a tetraarylethene derivative may be used as the ETL 36 of the common layer 39. The EIL 37 may be formed of, for example, barium (Ba) or Ca.

Various organic materials usable as the light-emitting layer 35 may include, for example, copper phthalocyanine (CuPc), N,N'-di(naphthalene-1-yl)-N,N'-diphenyl-benzidine (NPB), or Alq3. The above-described low molecular weight organic layers are formed by, for example, vacuum deposition.

Exemplary embodiments of the present invention are not limited to only the case where a low molecular weight organic layer is used as the common layer 39 and the light-emitting layer 35. That is, in a case where a polymer organic layer is used, the common layer 39 may be composed of, for example, a HTL 34 and the light-emitting layer 35 may be included as an EML. For example, poly(ethylenedioxythiophene) (PEDOT) may be used as the HTL, and a polymer organic material, such as poly(phenylenevinylenes) (PPVs) and polyfluorenes, may be used as the EML. The HTL 34 and the EML 35 may be formed by, for example, screen printing, inkjet printing, or laser induced thermal imaging (LITI).

Also, as illustrated in FIG. 5A, a thickness of the light-emitting layer 35 is, for example, entirely uniform. However, exemplary embodiments of the present invention are not limited thereto. That is, the light-emitting layer 35 in each of the sub-pixels R, G, and B may have, for example, different thicknesses suitable for a resonance structure or may further include an auxiliary light-emitting layer.

According to the present embodiment of the present invention, it is exemplified in FIG. 5A that, for example, the HIL 33, the HTL 34, the light-emitting layer 35, the ETL 36, and the EIL 37 are sequentially formed on the pixel-defining layer 32, and the slits 41 are then formed by irradiating regions between the sub-pixels R, G and B with a laser beam.

In this case, the slits 41 may be formed by, for example, laser cutting using a laser irradiation apparatus 70 and a laser mask 71. The laser mask 71 is used to allow only specific areas between the sub-pixels R, G, and B to be cut with a laser beam emitted from the laser irradiation apparatus 70. As illustrated in FIG. 5A, a portion of the common layer 39 between the sub-pixels R, G and B is cut with a laser beam emitted from the laser irradiation apparatus 70. As the current flowing in the common layer 39 may be blocked by the slits 41, the occurrence of leakage current may be prevented.

The slits 41 are formed, for example, across the common layer 39 in a perpendicular direction and one end of the slits 41 may extend to the pixel electrode 32. Also, different from FIG. 5A, the slits 41 may be included, for example, with the common layer 39. The slits 41 according to the present embodiment of the present invention are filled with partition walls 40 as described later and may block a leakage current from flowing in the common layer 39. Thus, the occurrence of stains may be prevented even in the case where the screen is in a black state.

FIG. 5B illustrates that the partition walls 40 are formed by forming an insulator in the slits 41 according to the present embodiment of the present invention.

As illustrated in FIG. 5B, the partition walls 40 are formed by, for example, inserting the insulator in the slits 41 because, in a case where the counter electrode 38 is formed after the slits 41 have been formed, a conductive material constituting the counter electrode 38 is introduced into the slits 41, and thus, the conductive material may act as a conductor. Therefore, to prevent this, the partition walls 40 including an insulating material that may fill the slits 41 are formed.

The partition walls 40 may include, for example, an insulating material for blocking the flow of the leakage current. For example, an organic or inorganic insulating material may be used as the insulating material constituting the partition walls 40. For example, the insulating material constituting the partition walls 40 may include one or more organic insulating materials selected from the group consisting of polyimide, polyamide, an acryl resin, benzocyclobutene, or a phenol resin. Also, the insulating material constituting the partition walls 40 may include, for example, an inorganic insulating material selected from the group consisting of $SiO_2$, $SiN_x$, $Al_2O_3$, copper oxide (Cu, terbium ($Tb_4O_7$), yttrium ($Y_2O_3$), niobium ($Nb_2O_5$), or praseodymium ($Pr_2O_3$).

The partition walls 40 are formed as illustrated in FIG. 5B, and a counter electrode 38 is then formed as illustrated in FIG. 4. The counter electrode 38 may be formed as, for example, a common electrode by being deposited on an entire surface of the substrate 20. In a case where the counter electrode 38 is formed, as the partition walls 40 are formed in the slits 41, the material constituting the counter electrode 38 is not introduced into the slits 41.

FIGS. 6A and 6B illustrate a part of a manufacturing process of an organic light-emitting display apparatus according to an embodiment of the present invention.

According to the present embodiment with reference to FIGS. 6A and 6B, when a common layer 39 is deposited, a mask is used to form slits 42a, 42b between the sub-pixels R, G and B.

That is, in the manufacturing process of FIG. 5A, the common layer 39 is completely deposited and the slits 41 are then formed by laser cutting using the laser irradiation apparatus 70. In contrast, in the present embodiment of FIG. 6A, slits 42a and 42b are formed by, for example, using a mask from the time when the common layer 39 is formed.

For example, as illustrated in FIG. 6A, when a hole injection layer 33 and a hole transport layer 34 are formed, a first mask 72 is used to form the hole injection layer 33 and the hole transport layer 34 on an entire surface of a substrate 20 except first slit 42a. The first mask 72 is set to allow the first slit 42a to be disposed in the non-light-emitting regions NL.

Next, a light-emitting layer 35 is patterned on the substrate 20. As described above, the light-emitting layer 35 is patterned in areas of the sub-pixels R, G, and B of the light-emitting regions of exemplary embodiments of the present invention.

Thereafter, for example, as illustrated in FIG. 6B, a second mask 73 is used to form an electron transport layer 36 and an electron injection layer 37 on entire surfaces of the light-emitting layer 35 and the hole transport layer 34 except second slits 42b. In this case, the second slit 42b is connected to the first slit 42a to form the slit penetrating through the common layer 39. Also, a mask that is, for example, the same as the first mask 72 may be used as the second mask 73. Microcurrent may not flow in the common layer 39 due to the first and second slits 42a and 42b formed in FIGS. 6A and 6B.

The first and second slits 42a and 42b are formed as illustrated in FIGS. 6A and 6B, partition walls 40 are formed in the first and second slits 42a and 42b as illustrated in FIG. 5B, and a counter electrode 38 is formed thereon. As the first and second slits 42a and 42b formed in processes illustrated in FIGS. 6A and 6B are only included within the common layer 39, one end of the partition wall 40 formed after the process of FIG. 6B, different from that illustrated in FIG. 5B, may be formed at an interface of the common layer 39 and a pixel-defining layer 32.

According to the present embodiment of FIGS. 6A and 6B, the first and second slits 42a and 42b may be formed in the common layer 39 without using the separate laser irradiation apparatus 70.

According to exemplary embodiments of the present invention, as partition walls for blocking the flow of a leakage current are formed in a common layer, an organic light-emitting display apparatus in which current sharing between pixels does not occur may be provided.

Having described exemplary embodiments of the present invention, it is further noted that it is readily apparent to those of ordinary skill in the art that various modifications may be made without departing from the spirit and scope of the invention which is defined by the metes and bounds of the appended claims.

What is claimed is:

1. An organic light-emitting display apparatus comprising:
a substrate;
a thin film transistor disposed on the substrate and including an active layer, a gate electrode, a source electrode and a drain electrode;
a pixel electrode electrically connected to the source electrode and the drain electrode;
a counter electrode corresponding to the pixel electrode;
a light-emitting layer disposed entirely within a plurality of light-emitting regions between the pixel electrode and the counter electrode;
a common layer disposed in the light-emitting regions and in a plurality of non-light-emitting regions around the light-emitting regions between the pixel electrode and the counter electrode, the common layer comprising a hole injection layer, a hole transport layer, an electron transport layer, and an electron injection layer; and
a plurality of partition walls including an insulating material disposed in and in contact with the common layer,
wherein the plurality of partition walls penetrate through the hole injection layer, the hole transport layer, the electron transport layer, and the electron injection layer while the counter electrode is not penetrated by the plurality of partition walls, and
wherein the counter electrode directly contacts and covers an entire top surface of the plurality of partition walls.

2. The organic light-emitting display apparatus of claim 1, wherein the partition walls comprise at least one material selected from the group consisting of polyimide, polyamide, an acryl resin, benzocyclobutene, a phenol resin, silicon oxide ($SiO_2$), silicon nitride ($SiN_x$), aluminium oxide ($Al_2O_3$), copper oxide ($CuO_x$), terbium ($Tb_4O_7$), yttrium ($Y_2O_3$), niobium ($Nb_2O_5$), and praseodymium ($Pr_2O_3$).

3. The organic light-emitting display apparatus of claim 1, wherein the partition walls are disposed in the non-light-emitting regions between the light-emitting regions.

4. The organic light-emitting display apparatus of claim 3, further comprising a pixel-defining layer disposed in the non-light-emitting region, wherein the partition walls are disposed on the pixel-defining layer.

5. The organic light-emitting display apparatus of claim 1, wherein the partition walls are configured to block a current from flowing in the common layer.

6. The organic light-emitting display apparatus of claim 1, wherein the hole injection layer, the hole transport layer, the electron transport layer, and the electron injection layer are sequentially disposed in a direction from the pixel electrode toward the counter electrode, and wherein the light-emitting layer is disposed between the hole transport layer and the electron transport layer.

7. An organic light-emitting display apparatus comprising:
a plurality of light-emitting regions; and
a plurality of non-light-emitting regions disposed between the plurality of light-emitting regions,
wherein the light-emitting regions are configured to emit light when a current flows from a pixel electrode to a counter electrode through a common layer and a light-emitting layer, and the common layer comprises a plurality of partition walls that are disposed in some areas of the non-light-emitting regions and include an insulating material,
wherein the common layer comprises a hole injection layer, a hole transport layer, an electron transport layer, and an electron injection layer, the plurality of partition walls penetrate through and are in contact with the hole injection layer, the hole transport layer, the electron transport layer, and the electron injection layer while the counter electrode is not penetrated by the plurality of partition walls,
wherein the light-emitting layer is disposed entirely within the plurality of light-emitting regions and the common layer is disposed in the light-emitting regions and the non-light-emitting regions, and
wherein the counter electrode directly contacts and covers an entire top surface of the plurality of partition walls.

8. The organic light-emitting display apparatus of claim 7, wherein the partition walls comprise at least one material selected from the group consisting of polyimide, polyamide, an acryl resin, benzocyclobutene, a phenol resin, silicon oxide ($SiO_2$), silicon nitride ($SiN_x$), aluminium oxide ($Al_2O_3$), copper oxide ($CuO_x$), terbium ($Tb_4O_7$), yttrium ($Y_2O_7$), niobium ($Nb_3O_3$), and praseodymium ($Pr_2O_3$).

9. The organic light-emitting display apparatus of claim 7, wherein the partition walls are configured to block a current from flowing in the common layer.

* * * * *